(12) United States Patent
Singhal et al.

(10) Patent No.: US 7,895,552 B1
(45) Date of Patent: Feb. 22, 2011

(54) EXTRACTING, VISUALIZING, AND ACTING ON INCONSISTENCIES BETWEEN A CIRCUIT DESIGN AND ITS ABSTRACTION

(75) Inventors: Vigyan Singhal, Fremont, CA (US); Soe Myint, Santa Clara, CA (US); Chung-Wah Norris Ip, Fremont, CA (US); Howard Wong-Toi, Albany, CA (US)

(73) Assignee: Jasper Design Automation, Inc., Mountain View, CA (US)

( * ) Notice: Subject to any disclaimer, the term of this patent is extended or adjusted under 35 U.S.C. 154(b) by 284 days.

(21) Appl. No.: 11/092,994

(22) Filed: Mar. 28, 2005

Related U.S. Application Data

(60) Provisional application No. 60/556,593, filed on Mar. 26, 2004.

(51) Int. Cl.
*G06F 17/50* (2006.01)

(52) U.S. Cl. .................................... 716/106; 716/107
(58) Field of Classification Search .................. 716/4–5, 716/106–107; 703/14
See application file for complete search history.

(56) References Cited

U.S. PATENT DOCUMENTS

| | | | | |
|---|---|---|---|---|
| 5,163,016 | A * | 11/1992 | Har'El et al. ................... | 716/5 |
| 5,541,849 | A * | 7/1996 | Rostoker et al. .............. | 716/18 |
| 5,870,588 | A * | 2/1999 | Rompaey et al. .............. | 703/13 |
| 6,324,678 | B1 * | 11/2001 | Dangelo et al. ................ | 716/18 |
| 6,760,889 | B2 * | 7/2004 | Kawamoto ..................... | 716/3 |
| 6,957,404 | B2 * | 10/2005 | Geist et al. ..................... | 716/4 |
| 6,975,976 | B1 * | 12/2005 | Casavant et al. ............... | 703/14 |
| 7,065,726 | B1 * | 6/2006 | Singhal et al. .................. | 716/5 |
| 7,076,753 | B2 * | 7/2006 | Cerny et al. ..................... | 716/5 |
| 7,149,987 | B2 * | 12/2006 | Zhu et al. ........................ | 716/4 |
| 7,203,631 | B2 * | 4/2007 | Fraer et al. ..................... | 703/14 |
| 7,249,332 | B1 * | 7/2007 | Agmon ........................... | 716/5 |
| 7,412,674 | B1 * | 8/2008 | Singhal et al. ................. | 716/5 |
| 7,418,678 | B1 * | 8/2008 | Ip et al. .......................... | 716/5 |
| 7,506,288 | B1 * | 3/2009 | Ip et al. .......................... | 716/5 |
| 2002/0095645 | A1 * | 7/2002 | Rodeh ............................ | 716/4 |
| 2003/0005393 | A1 * | 1/2003 | Kawamoto ..................... | 716/3 |
| 2003/0208730 | A1 * | 11/2003 | Singhal et al. ................. | 716/4 |
| 2004/0049371 | A1 * | 3/2004 | Fraer et al. ..................... | 703/14 |
| 2004/0123254 | A1 * | 6/2004 | Geist et al. ..................... | 716/4 |
| 2007/0050740 | A1 * | 3/2007 | Jacobi et al. ................... | 716/5 |

OTHER PUBLICATIONS

Wang, D. et al., "Formal Property Verification by Abstraction Refinement with Formal, Simulation and Hybrid Engines," 38th Design Automation Conference (DAC'01), Jun. 6, 2001.

* cited by examiner

*Primary Examiner*—Paul Dinh
*Assistant Examiner*—Patrick Sandoval
(74) *Attorney, Agent, or Firm*—Fenwick & West LLP

(57) ABSTRACT

In the field of functional verification of digital designs in systems that use an abstraction for portions of a circuit design to perform the verification proof, a tool is described for resolving inconsistencies between the design and abstractions for the design. The tool provides information to a user about intermediate steps in the verification process. In response, the user may provide insight about the design to allow the tool to adjust the verification analysis of the design. The information provided to the user, including possible conflicts between the design and its abstractions, may include visualization techniques to facilitate the user's understating of any inconsistencies.

33 Claims, 9 Drawing Sheets

EXTRACTING, VISUALIZING, AND ACTING ON INCONSISTENCIES BETWEEN A CIRCUIT DESIGN AND ITS ABSTRACTION

CROSS REFERENCE TO RELATED APPLICATIONS

This application claims the benefit of U.S. Provisional Application No. 60/556,593, filed Mar. 26, 2004, which is incorporated by reference in its entirety.

BACKGROUND

1. Field of the Invention

This invention relates generally to the field of functional verification of digital designs in systems that use an abstraction for portions of a circuit design to perform the verification proof, and in particular to resolving inconsistencies between the design and abstractions for the design.

2. Background of the Invention

Over the last 30 years, the complexity of integrated circuits has increased greatly. This increase in complexity has exacerbated the difficulty of verifying circuit designs. In a typical integrated circuit design process, which includes many steps, the verification step consumes approximately 70-80% of the total time and resources. Aspects of the circuit design such as time-to-market and profit margin greatly depend on the verification step. As a result, flaws in the design that are not found during the verification step can have significant economic impact by increasing time-to-market and reducing profit margins. To maximize profit, therefore, the techniques used for verification should be as efficient as possible.

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation. RTL describes the registers of a computer or digital electronic system and the way in which data are transferred among the combinational logic between registers.

Existing verification and debugging tools are used in the design flow of a circuit. The design flow begins with the creation of a circuit design at the RTL level using RTL source code. The RTL source code is specified according to a Hardware Description Language (HDL), such as Verilog HDL or VHDL. Circuit designers use high-level hardware description languages because of the size and complexity of modern integrated circuits. Circuit designs are developed in a high-level language using computer-implemented software applications, which enable a user to use text-editing and graphical tools to create a HDL-based design.

An increasingly popular technique is to use formal methods to verify the properties of a design completely. Formal methods use mathematical techniques to prove that a design property is either always true or to provide an example condition (called a counterexample) that demonstrates the property is false. Tools that use formal methods to verify RTL source code and design properties are known as "model checkers." Design properties to be verified include specifications and/or requirements that must be satisfied by the circuit design. Since mathematical properties define the design requirements in pure mathematical terms, this enables analysis of all possible valid input sequences for a given circuit and is akin to an exhaustive simulation. Formal verification methods are therefore exhaustive, when compared for example to simulation methods, and they may provide many benefits, such as reduced validation time, quicker time-to-market, reduced costs, and high reliability.

Performance limits and resource availability inhibit the widespread use of model checking. The resources required to perform verification are typically exponentially related to the number of registers in the circuit model, as well as other characteristics. This is referred to as the "state space explosion" problem. Many conventional model checkers analyze the entire design before proving a particular property, verifying the behavior of the design with all possible input sequences values over time. These model checking techniques thus rely on an underlying reachability analysis and must iterate through time to collect all possible states into a data structure. But the complexity and size of modern integrated circuits, combined with the state space explosion problem, make it impossible to use conventional model checkers on complex designs.

State space reduction techniques are used to combat the state space explosion problem. One technique for state space reduction, the cone of influence reduction, performs formal verification of a given property on the cone of influence rather than on the whole design. The cone of influence is any portion of the circuit design that potentially affects the proof result of the property; the portion of the design outside of the cone of influence does not affect the property. However, the state space explosion problem may still occur with this technique because the cone of influence can be very large in complex designs.

Another technique to address the state space explosion problem uses abstractions in place of certain portions of the cone of influence and verifies a sub-cone of influence, or analysis region. This abstraction allows signals on the boundary of the analysis region can take on any value; thus, abstractions exhibit behavior that is a superset of the actual behavior of the design. If a property is proved true on a portion of a design using an abstraction, it must be true for the entire design because the abstraction contains a superset of the behavior exhibited by the design. But if a property is proved false on a design using an abstraction, the values of the signals on the boundary of the analysis region and abstraction may be causing the false result instead of a real design error. Because the values are a superset of their actual behavior, it is necessary to modify the abstraction.

Accordingly, what are needed are techniques to identify and present inconsistencies between a design and its abstractions during the formal verification process.

SUMMARY OF THE INVENTION

A new use model for formal verification improves the practicality of formal verification, allowing for the resolution of conflicts or inconsistencies between a circuit design and its abstraction. The new use model breaks down the generation of a formal proof into multiple steps and allows a user to provide insight about the design between steps through the manual analysis of the intermediate results. The model may also provide visual information to the user, further enabling the user to provide more useful feedback in the resolution process.

In one embodiment, a computer program product and computer-implemented method are provided for resolving inconsistencies between a circuit design and its abstraction. A tool performs functional verification to analyze an abstraction of a circuit design, where the abstraction comprises an analysis region that includes a portion of the circuit design. The circuit design is also simulated, and the tool detects an inconsistency between the analyzed abstraction and the simulated circuit design. Once an inconsistency is detected, the tool presents the inconsistency for a user to review, allowing a user to adjust the abstraction to eliminate the inconsistency.

DETAILED DESCRIPTION OF THE PREFERRED EMBODIMENTS

Overview

Figure 1A:
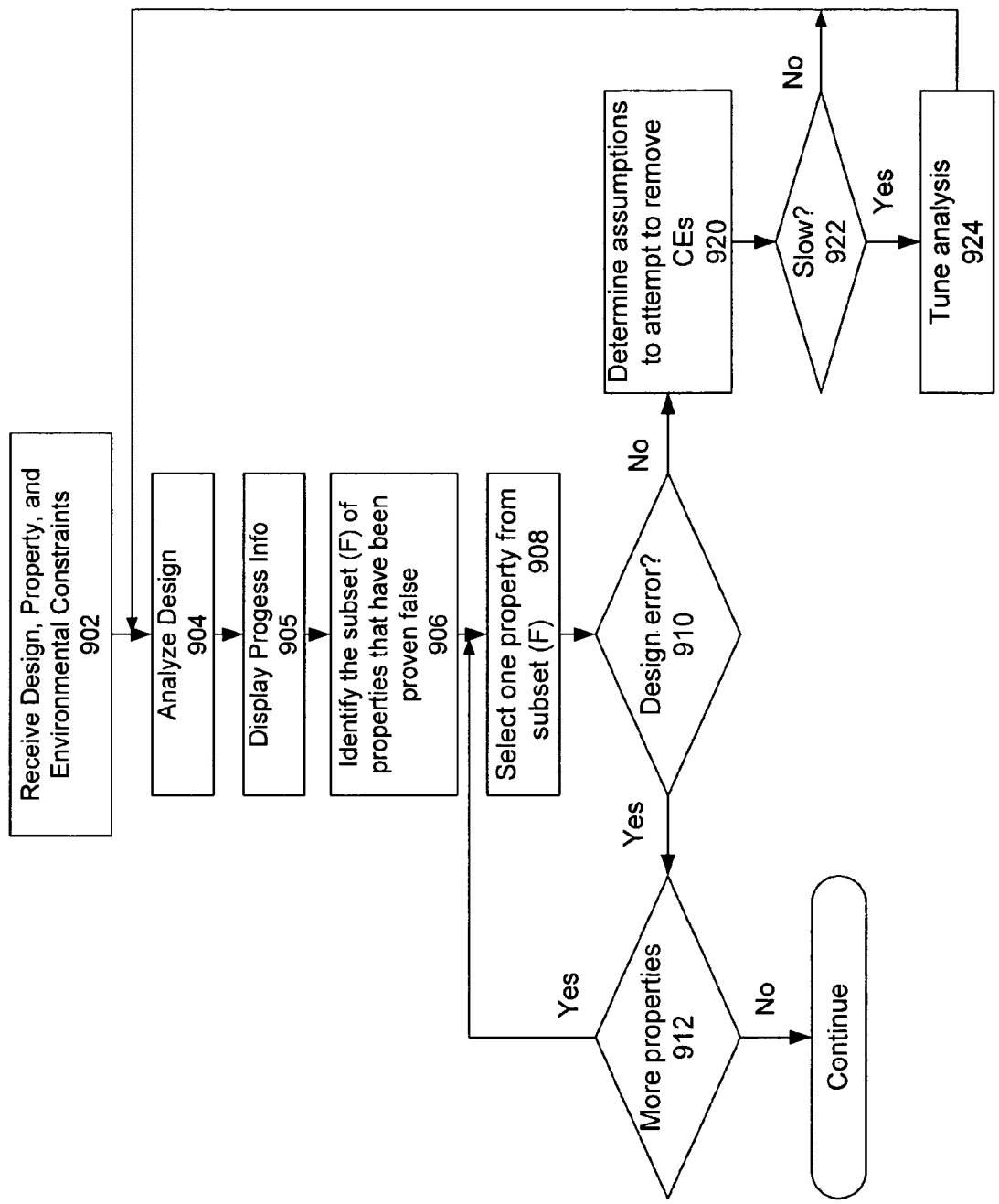
FIGS. 1A and 1B are flow charts for a process of resolving possible inconsistencies between a circuit design and its abstractions during a functional verification process, in accordance with embodiments of the invention.
Figure 1B:
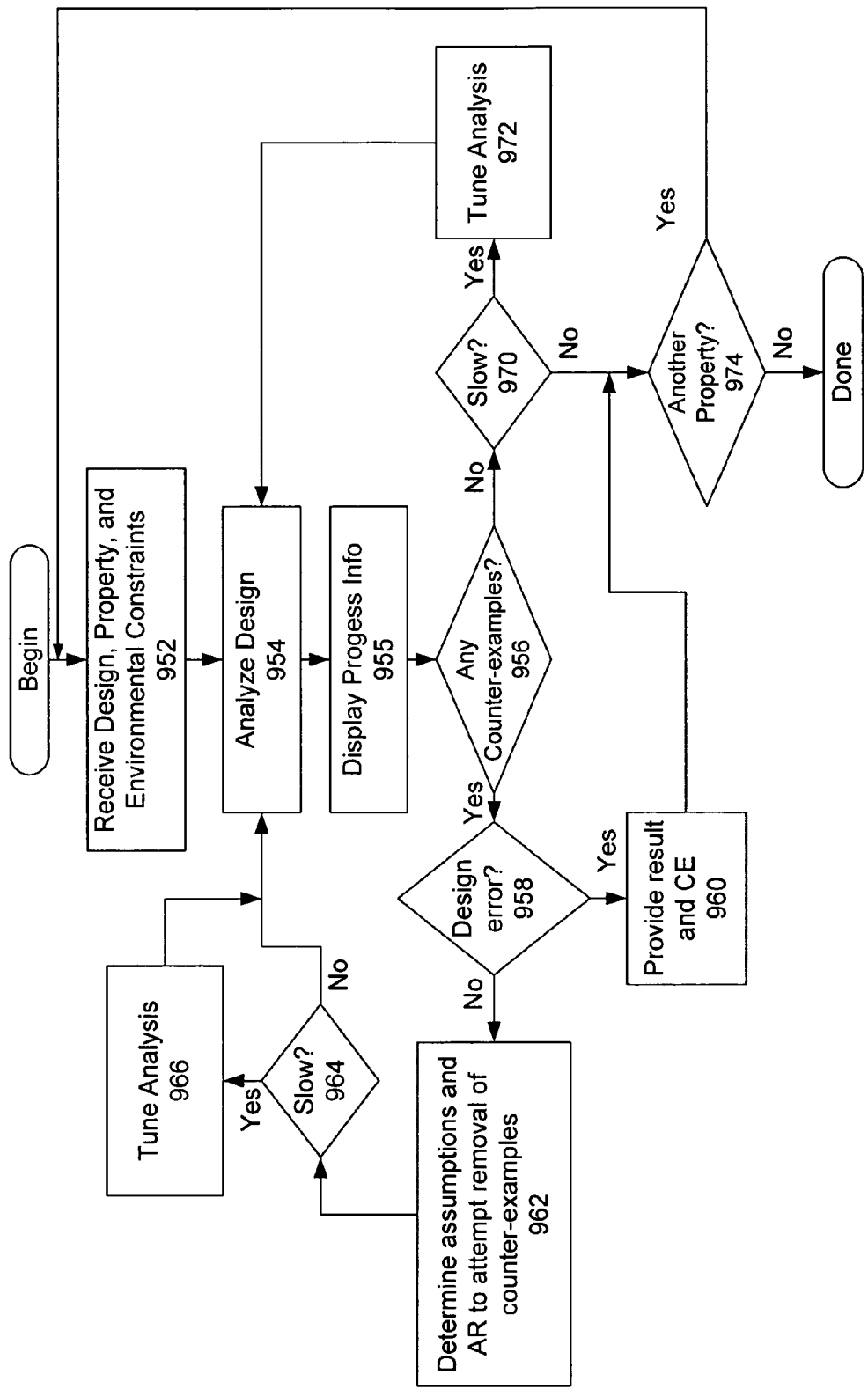

General approaches for resolving inconsistencies in a system are illustrated in the flow charts of FIGS. 1A and 1B. The flow chart shown in FIG. 1A guides users to remove false negatives by providing feedback on the cost and effects of possible assumptions that are provided by the user or generated by the tool. FIG. 1B illustrates a similar process for guiding a user to remove false negatives, but the embodiment illustrated in FIG. 1B includes steps for dealing with methodologies that use the concept of an analysis region (AR).

With reference to FIG. 1A, a verification software suite (e.g., a "tool") receives 902 a circuit design, a set of properties or requirements, and a set of environmental constraints for the functional verification process. The tool then analyzes 904 the circuit design to perform verification thereon. In one embodiment, this analysis includes a formal verification process as set forth in U.S. application Ser. No. 10/745,993, filed Dec. 24, 2003, which is incorporated by reference in its entirety. Unless the circuit design being tested has no errors, the formal verification process results in a false result for a set of properties that are violated by the circuit design. The tool thus identifies 906 the subset (F) of properties that have been proven false, and it selects 908 a first property from this subset (F). This property, and possibly one or more counterexamples that show how the property is violated, is available to a user. For example, a user may be presented graphically with the waveform for a counterexample of the violation. Having access to this information, the user may be able to help determine the cause of the violation.

Accordingly, the user decides 910 whether the violation is the result of a design error in the circuit design or whether the violation is a false negative (e.g., due to a imprecise abstraction). Once this determination is made, the user may provide this information to the tool. If the violation trace was due to a design error, there is no inconsistency to be resolved; therefore, the tool then determines 912 whether additional properties exist and repeats the process for a next violated property. As long as there is a next violated property, the process continues and another property from the subset (F) is selected 908; otherwise, the process ends.

But if 910 the user determines that the violation was not caused by a design error, the violation was a false negative and the analysis for the verification process must therefore be adjusted. To adjust the verification analysis in one embodiment, the tool determines 920 one or more assumptions that could be added to the analysis to attempt to remove the counterexample. (An embodiment of this step is described in greater detail with reference to step 962 in FIG. 1B). Additionally, the user may determine 922 whether the process was too slow and provide that information to the tool. If 922 the process was too slow, the tool preferably tunes 924 the analysis to speed up any future verification analyses. Embodiments for tuning the analysis are described in greater detail below with reference to FIG. 2. With the analysis adjusted to attempt to remove the counterexample for the false negative, the circuit design is again analyzed 904 in accordance with a functional verification process.

With reference to FIG. 1B, an embodiment of the tool handles functional verification methodologies that apply the concept of an analysis region (AR) to a circuit design. An analysis region allows for a portion of a design to be identified as relevant for a given property so that other parts of the design outside of the analysis region can be ignored when testing the property. In this way, highly complex designs can be simplified for verification. A more detailed description of the use of an analysis region in verification methodologies is set forth in U.S. patent application Ser. No. 10/389,316, which is incorporated by reference herein in its entirety. In accordance with the process illustrated in FIG. 1B, the tool provides feedback to allow a user to evaluate the cost and effects of an action on the manipulation of the environmental constraints and/or the analysis region before the user actually directs the tool to take the action.

FIGS. 1A and 1B thus describe a method in accordance with an embodiment of the present invention for verifying a property of a given circuit model in conjunction with a set of environmental constraints while providing the user with relevant information (e.g., cost and effect of possible modifications to the environmental constraints and/or analysis regions).

With reference to FIG. 1B, the circuit description, a property to be verified and an initial set of environmental constraints are received 952 by the system as inputs. The design is analyzed 954, for example, using the method described above, to determine if a requirement is satisfied in context of the environmental constraints and the initial analysis region as determined by the tool. For ease of discussion, when an entire circuit design is analyzed, the analysis region is referred to as the entire design. The tool analyzes 954 the circuit design to determine for a number of requirements whether the corresponding property is satisfied or violated under a number of operating conditions. If the requirement is not always true, one or more counterexamples are typically generated in the functional verification process. If 956 one or more counterexamples are generated during the analysis 954, the counterexamples are presented to the user for review, as described above. A user determines 958 if the counterexample represents a true design error or a false negative. If the counterexample represents a design error, the analysis for that property can be concluded and the counterexamples outputted 960, after which the verification process may end. Specific aspects of embodiment of the invention are now discussed in more detail with reference to FIG. 1B.

Eliminating False Counterexamples

Figure 3:
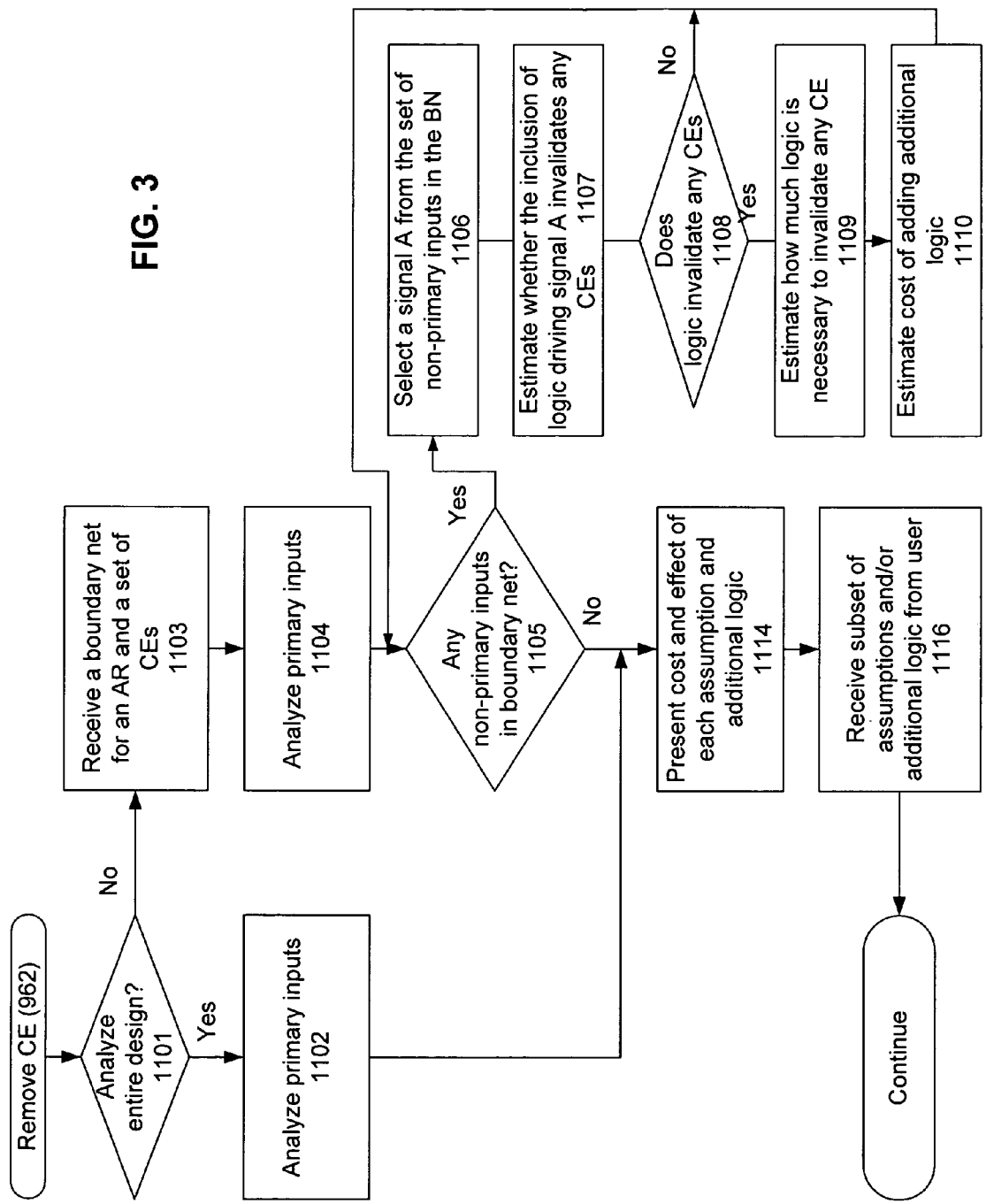
FIG. 3 is a flow chart of a process for identifying assumptions and/or modifications to an analysis region for eliminating a counterexample, in accordance with an embodiment of the invention.

As explained above, false counterexamples may be eliminated from the formal verification by adding certain assumptions to the inputs of the formal verification. With reference to FIG. 1B, if the user determines 958 that the counterexamples do not correspond to a design error, the false negative is due to an inconsistency rather than a true design error. Accordingly, the tool helps the user eliminate the counterexamples for false negatives by identifying 962 one or more assumptions to add to the analysis and/or possible modifications to the analysis region. Preferably, the cost and effect of these potential changes to the analysis are also determined and provided to the user. A more detailed description of this process is illustrated in FIG. 3, which illustrates an embodiment of a method for identifying assumptions and/or modifications to the analysis region for eliminating the identified counterexamples. The embodiment shown in FIG. 3 can be understood with reference to an example circuit design shown in FIG. 5, showing a schematic of a circuit design to be verified.

Figure 5:
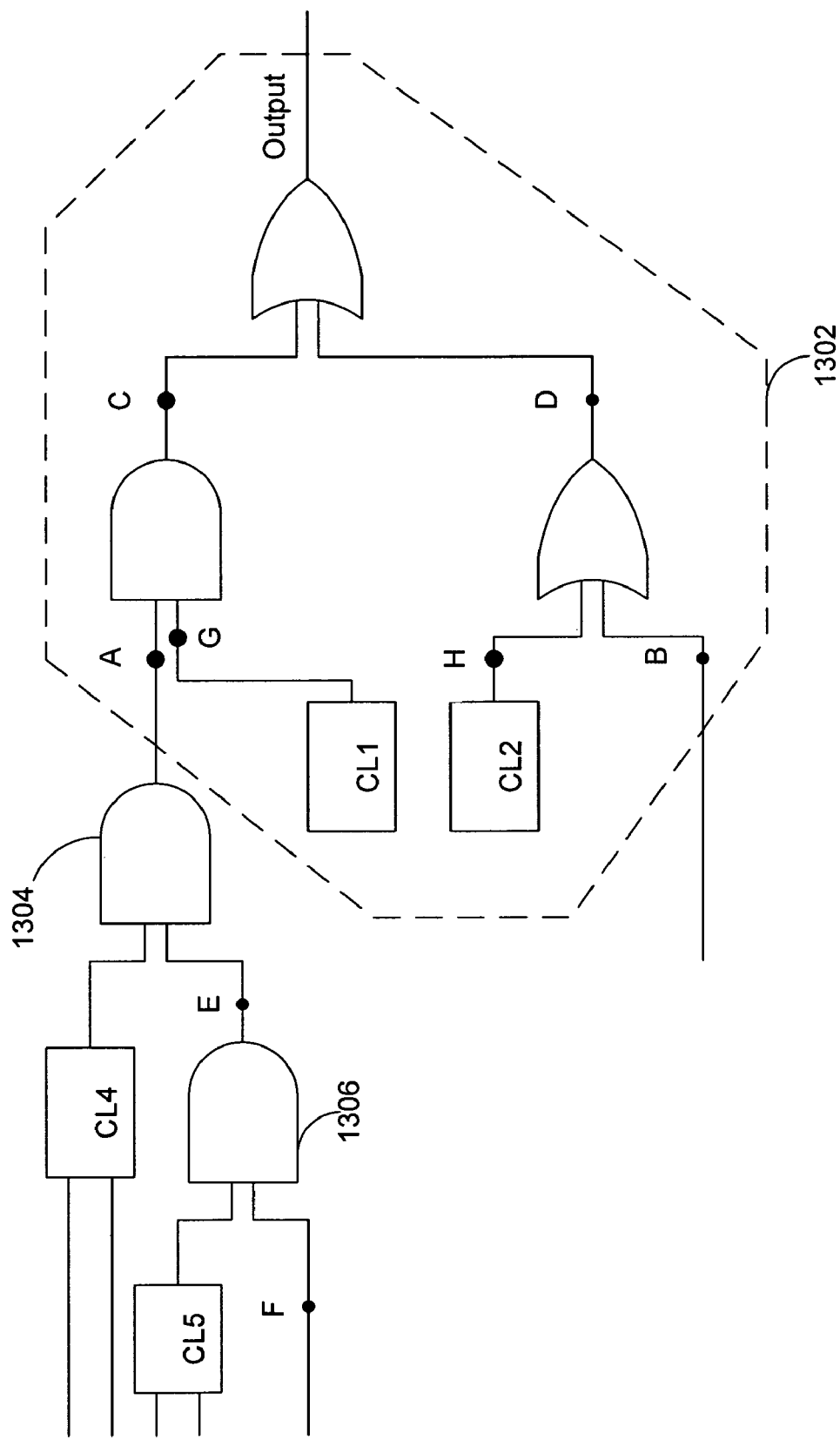
FIG. 5 is a schematic of an example of a circuit design to be verified in accordance with an embodiment of the invention.

An initial analysis region 1302 is defined for the example circuit design in FIG. 5. In this embodiment, if 1101 the analysis region is a subset of the entire design being analyzed, the tool receives 1103 a set of nets for the analysis region (AR) and a set of counterexamples (CEs). In the example, the set of boundary nets includes signal A, primary signal B, and each of the primary inputs driving complex logic CL1 and CL2 (the inputs not shown). In this example there is one assumption, F==0, and there is one requirement to prove that the output is equal to zero at all times (Output==0). Two counterexamples are thus identified, CE1 and CE2:

A==1&&B==X  (CE1)

B==1&&A==X  (CE2)

The tool then analyzes 1104 the primary inputs. In this example, signal B is the only primary input (into the analysis region 1302) that is relevant to the two counterexamples.

Figure 4:
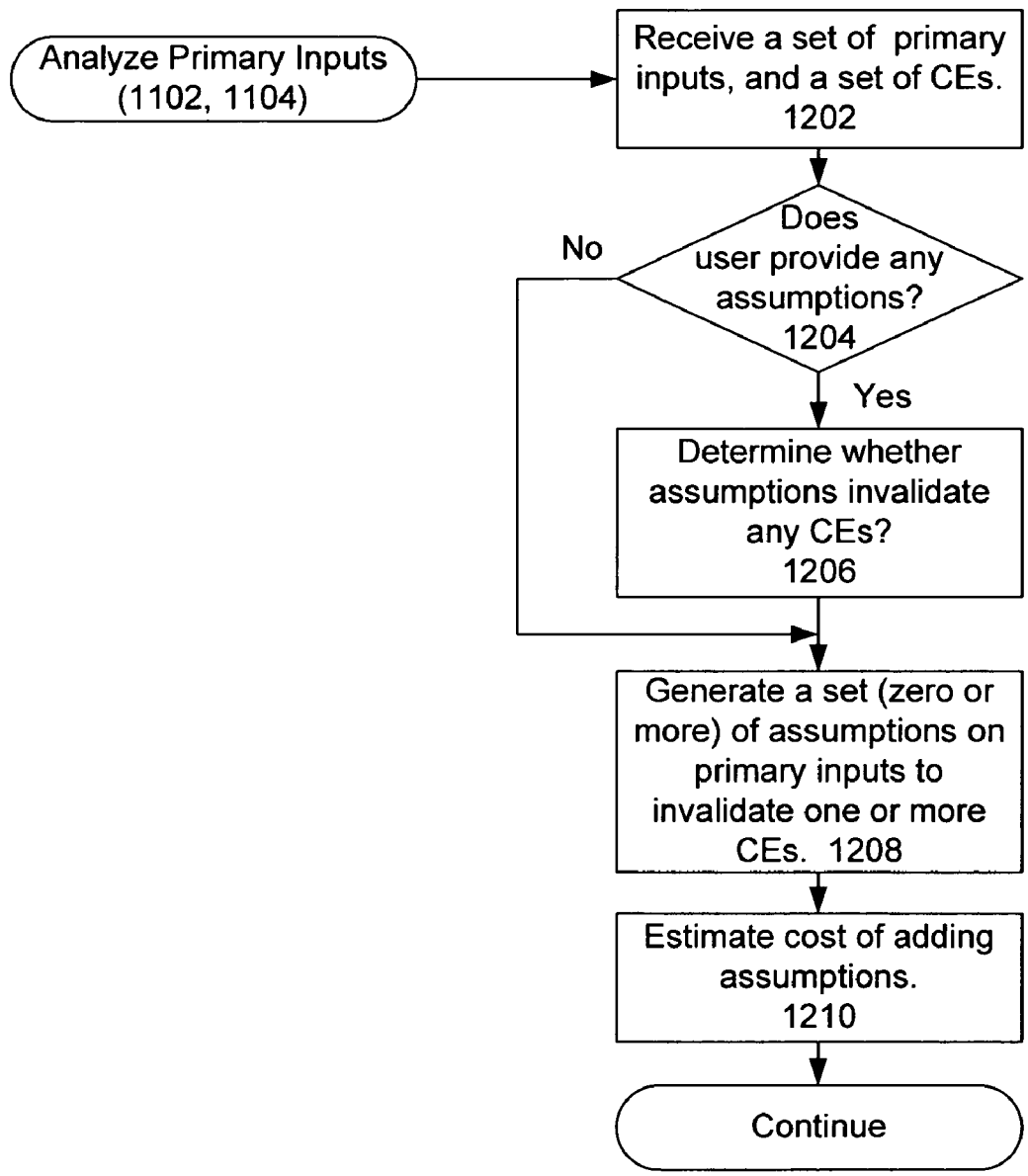
FIG. 4 is a flow chart of a process for analyzing an analysis region, such as in steps 1102 and 1104 of FIG. 3, according to one embodiment of the present invention.

A more detailed description of the step of analyzing 1104 the analysis region is set forth in FIG. 4, which illustrates a method for analyzing primary inputs according to one embodiment of the present invention. To analyze the primary inputs, the tool receives 1202 the set of primary inputs (e.g., signal B) and a set of counterexamples (e.g., CE1 and CE2). If 1204 the user provides one or more assumptions manually, the tool determines 1206 whether any of the assumptions invalidates any of the counterexamples. Otherwise, the user does not provide any assumptions on signal B and the process continues by generating 1208 a set of assumptions on primary inputs that invalidates one or more counterexamples. Each of the identified primary inputs (here, just signal B) is compared against the counterexamples to determine whether an assumption can be identified that will eliminate a counterexample. In the example, primary signal B is compared with CE1. But in CE1 signal B is a "don't care," so no assumption for signal B would eliminate CE1. For counterexample CE2, however, the value of B is equal to 1. Therefore, the tool identifies the assumption B==0 as an assumption that will eliminate CE2.

The tool then estimates 1210 the cost/savings of adding assumptions. The cost/savings can correspond to a variety of factors that affect the performance of the verification. In one embodiment, the cost/savings is based on one or more of the following principles: (1) The size of the corresponding binary decision diagram (BDD) used to capture the assumption gives a quantitative indication of the speed of any operation that involves such an assumption, where the larger the BDD, the slower the analysis will become. (2) The assumption may also simplify the analysis by causing other assumptions or logic in the design to become irrelevant to the analysis. In the example, if an assumption "B==1" is introduced, the signal D will have the value 1 regardless of the value in the signal H and the activities in CL2 because of the OR-gate between signal B and D. The size of the corresponding BDD used to capture CL2 gives a quantitative indication of the resulting speed up. (3) Instead of using a Boolean expression on existing signals in the design as an assumption, an assumption may assume the input to have the same value as a signal being driving by an arbitrary complex logic, in which case it may capture temporal behavior. The cost or saving of including this assumption depends on the characteristics of the logic, such as: (a) the size of the corresponding BDD used to capture the logic gives a quantitative indication of the speed of any operation involving this assumption; (b) a counter-like behavior in this logic leads to more iterations in the analysis, and therefore, the range of possible values in this counter gives a quantitative indication of the number of iterations required to complete the analysis; and/or (c) a datapath-like behavior in this logic leads to more states to be maintained as reachable set during the analysis, and therefore, the width of the datapath gives a quantitative indication of the complexity in manipulating the reachable set.

There may also be other possibilities that affect the cost/savings of adding an assumption. Additional effects may take into account generic and application-specific design characteristics, such as the use of FIFO, memory, decoder, pipeline logic, and the like. By providing feedback on the cost or savings of making this assumption, the tool may provide the user information allowing the user to make a more educated decision about whether to add any suggested assumptions. Alternatively, the user may decide to invest more time devising a better assumption or even incorporate an appropriate abstraction into the assumption. The tool may also suggest appropriate abstraction for specific characteristics of the logic.

In the example of FIG. 5, the savings of adding the assumption B==0 is not significant because that assumption would not eliminate the need to analyze any significant block of logic. That is, since signal B and signal H are inputs to an OR gate, even if signal B were zero, the output of the OR gate (signal D) would still depend upon the output (signal H) of the complex logic block CL2. Even with this assumption, therefore, complex logic block CL2 would need to be to be analyzed. However, the BDD corresponding to "B==0" is also small, so, overall, adding the assumption would not introduce high overhead either and would probably reduce the states being stored in the reachable set. As a result, the tool may conclude that the assumption would not have an adverse effect on the performance, and, therefore, the assumption should be added to eliminate the counterexample CE2. The process then continues with the flow, returning to the completion of step 1104 in FIG. 3.

The tool continues by determining 1105 whether there are any non-primary inputs in the boundary nets of the analysis region 1302. A signal is selected 1106, and then the tool estimates 1107 whether the inclusion of this signal in the analysis region invalidates any of the counterexamples. For example, in an embodiment, the answer may be estimated through a 3-value simulation of the full design using values from the counterexample for the primary inputs. If the logic invalidates 1108 a counterexample, the tool estimates 1109 how much logic is necessary to invalidate any counterexample. Otherwise, the tool determines if there are any other non-primary inputs in the boundary net 1105. The tool estimates 1109 the amount of logic using an intelligent traversal of the netlist representing the design. This traversal can be performed using a conventional depth first search (DFS) algorithm. During the traversal, the search explores the part that is inconsistent when the values from the counterexample and from the simulation are different.

In the example of FIG. 5, the only boundary net that is not a primary input is signal A (as signal B is a primary input). The tool identifies the logic driving signal A as an AND-gate 1304 that is driven by signal E and complex logic block CL4. Since the value of A is 1 in CE1, the tool determines whether E or CL4 must be 0. If so, it would invalidate CE1. During the DFS, the next signal being considered is E, and the tool identifies that it is the output of an AND gate 1306 having inputs of signal F and complex logic block CL5. Therefore, the tool determines whether F or CL5 must be 0. Since an initial assumption the invention received at step 902 is that signal F is equal to 0, the tool determines that with F==0, signal E must be zero and subsequently signal A must be equal to zero. If A==0, then counterexample CE1 is invalidated because it requires signal A to be equal to one. Accordingly, the tool estimates 1109 that adding the two AND-gates (1304,1306) and the assumption "F==0" to the current analysis will invalidate CE1. Furthermore, since F==0, complex logic block CL5 does not need to be analyzed since its output has no effect on the verification. Similarly, since E==0, complex logic block CL4 does not need to be analyzed since its output has no effect on the verification.

The tool then estimates 1110 the cost of adding additional logic. As described above, a variety of measures can be used to estimate the cost/savings of adding additional logic. In one embodiment, instead of using a Boolean expression as an assumption, the tool can use the logic driving the boundary nets. As a result, the complexity of the logic as determined by the size of the BDD used to capture the logic is usually higher than an assumption. Furthermore, it may be desirable to analyze cost or saving according to the characteristics of the logic, such as whether it is a counter, a datapath, a memory, a decoder, or other circuit component.

In this example, the cost of adding additional logic includes the cost of adding two AND gates 1304 and 1306. However, the cost of complex logic blocks CL4 and CL5 are not included because the output of these complex logic blocks has no effect on the Output signal. As a result, the corresponding BDD represents a three-input AND-gate. Furthermore, if this BDD were combined with the BDD corresponding to the assumption "F==0", the analysis can be simplified into a BDD that says A==0, which is even simpler than the three-input AND-gate. Furthermore, because the tool identified that the assumption F==0 implies A==0, the value of signal G has no effect on the output (since if A==0, then C==0). Accordingly, the tool includes in the cost estimation the cost saved by eliminating the logic (CL1) that drives signal G. The cost savings can be estimated based upon the size of the BDD representing the CL1 logic, as well as whether the CL1 logic is a counter.

After estimating the cost and effect of each assumption and additional logic to the analysis region, the tool presents 1114 the cost and effect to the user using a graphical user interface or other technique to provide the user with the information (e.g., sending the information to a file). The tool provides to the user the assumptions, effect, and cost generated in step 1104 or 1102 (discussed below) along with the cost and effect of adding logic as determined in steps 1108 and 1110. The invention may also prioritize the assumptions by their effects and costs and extract analysis such as "adding assumption A will lead to a faster analysis than adding assumption B" or "adding both assumptions A and B will remove all existing counterexamples, but it will slow down the analysis." Furthermore, the tool may suggest a possible abstraction that allows incorporation of a certain assumption with reduced cost. The tool may also prioritize adding additional logic by their effects and costs, and extract analysis, such as: "adding the logic driving signal A will remove the existing counterexample, but will slow down the analysis."

In this example, the tool outputs the assumption B==0, the effect of the assumption (i.e., an indication that this assumption will eliminate counterexample CE2), and the cost of adding this assumption (which, in this example, is not significant and can be elaborated as the size of additional BDDs). The tool suggests adding the additional logic driving signal A, the effect of adding the logic, i.e., an indication that this assumption will eliminate CE1, and the cost of adding the additional logic including the savings of removing other logic (CL1) which is not needed. The tool then receives 1116 a selection of the assumptions and/or additional logic from the user, who may use the information provided by the tool to make an intelligent selection. While the user may select all, some, or none of the possibilities generated by the tool and may provide other assumptions or logic that have not been suggested by the tool.

Alternatively, if 1101 the verification is of a complete design (e.g., if the analysis region is the entire design to be verified), the tool will analyze 1102 the primary inputs of the design. As with step 1104, the tool may analyze 1102 the primary inputs as described in more detail above with respect to FIG. 4. After analyzing 1102 the primary inputs, the cost and effect of each assumption is presented 1114 to the user, after which the tool receives 1116 a subset of the assumptions from the designer as described above. In this case, during the tuning 916 of the analysis, described below, one embodiment of the invention may focus on removing or changing assumptions. This allows the tool to keep the analysis region as the full design. Another embodiment may focus on adding assumptions or removing logic from the design to form an analysis region that is less than the entire design.

Figure 6:
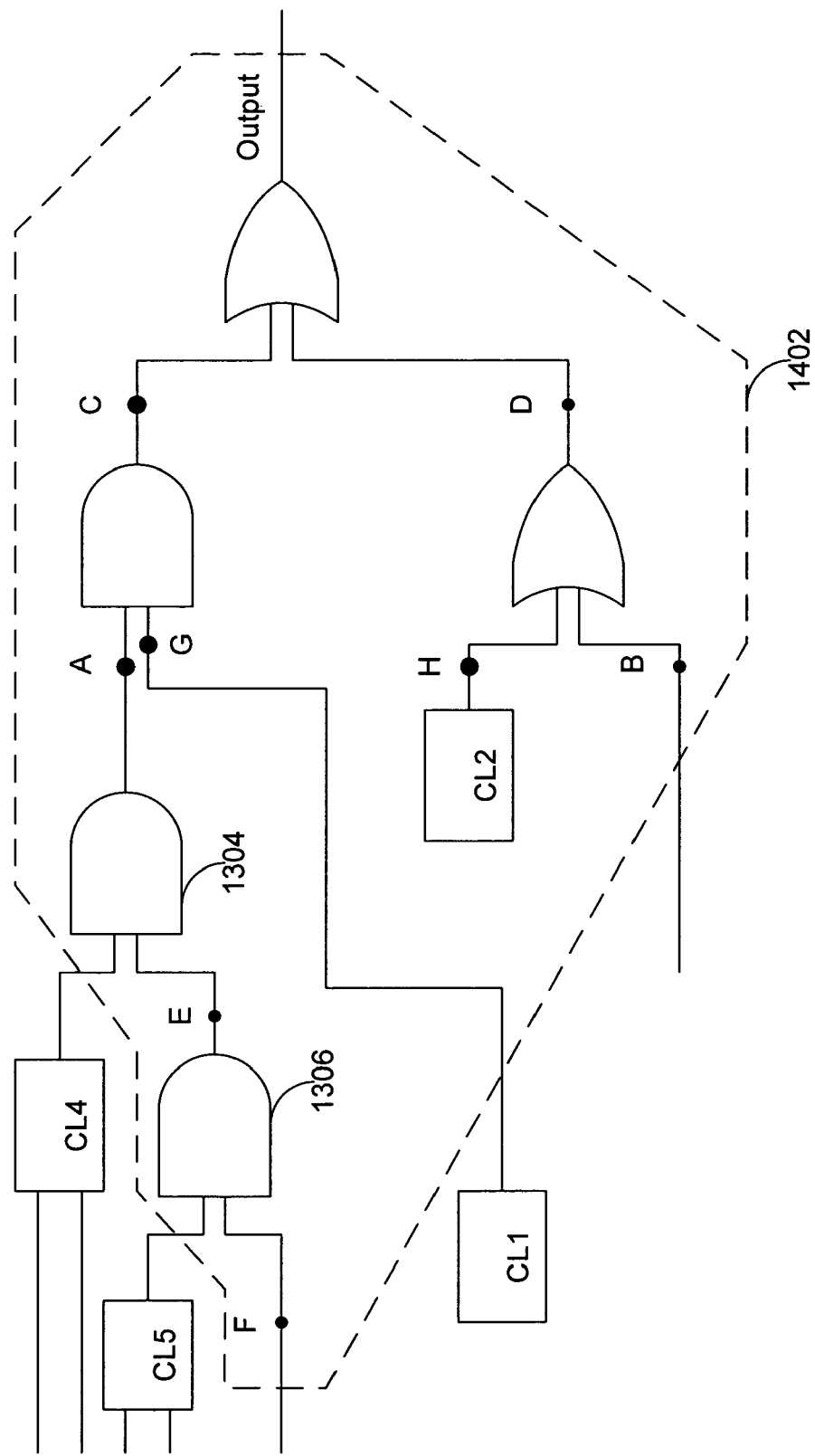
FIG. 6 is a schematic of the example shown in FIG. 5 having an analysis region adjusted in accordance with an embodiment of the invention.

In this example, the user may elect to utilize the additional logic driving the signal A (including AND gates 1304 and 1306) and the assumption B=0. Therefore, the analysis region 1402 changes, as illustrated in FIG. 6. FIG. 6 illustrates an example of a design to be verified according to the modified analysis region.

Tuning

Referring again to FIG. 1B, after determining 962 potential assumptions and potential analysis regions to attempt removal of counterexamples, the tool receives an indication from the user as to whether 964 the verification process was too slow. This user input can be obtained through any of a number of know user interface means, such as by requesting this information through a dialog window. It is not uncommon for verification processes to take several hours to prove complex designs. If 964 the user determines that the process is too slow, the tool provides options and information to the user regarding how to decrease the verification time by tuning

Figure 2:
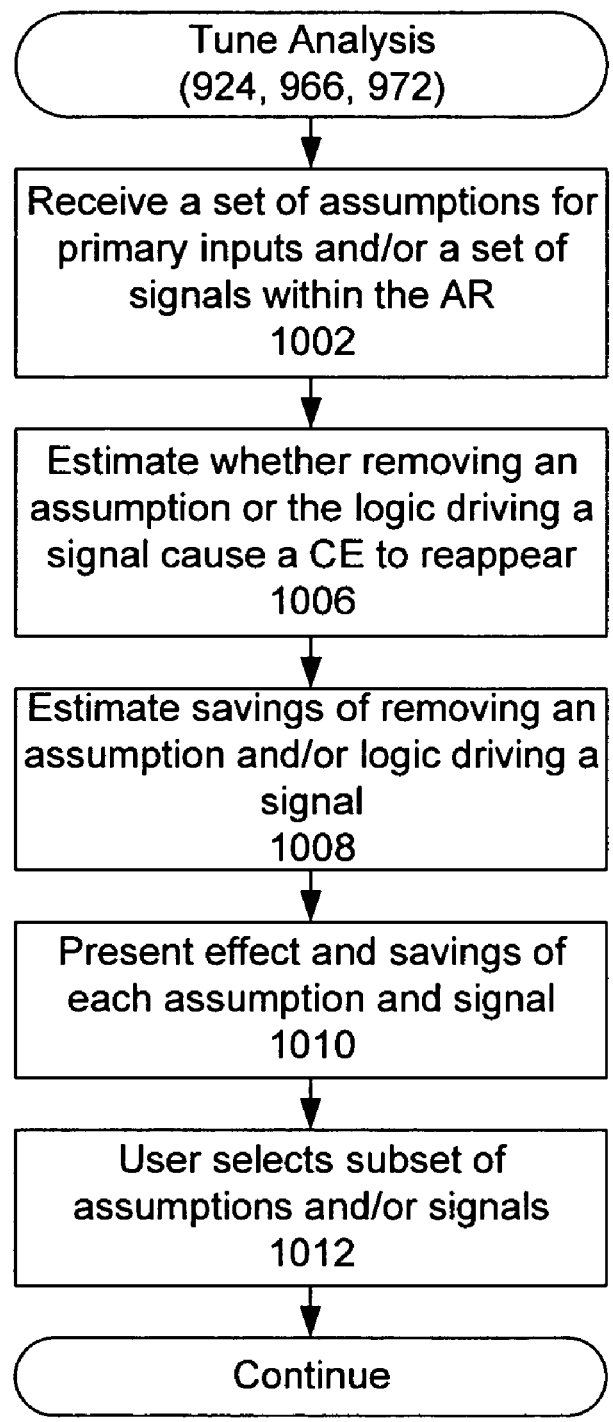
FIG. 2 is a flow chart of a process for tuning a circuit design for functional verification, in accordance with an embodiment of the invention.

966 the analysis. FIG. 2 describes in more detail one embodiment for tuning 966 the analysis.

FIG. 2 illustrates a method for tuning the analysis according to one embodiment of the invention. The tool receives 1002 a set of assumptions for primary inputs and/or a set of signals within the analysis region. In the example described above and illustrated in FIG. 6, the current set of assumptions for the primary inputs is:

$B==0$ $F==0$

In this example, signals within the analysis region include signals C, D, H, A, E, etc. In step 1002, the tool may select a subset of these signals to be analyzed or the user may identify them manually. In one example, the signal H is selected by the tool or by the user. The analysis region 1402 is analyzed and the set of stored counterexamples would be CE1 ($A==1$ && $B==X$) and CE2 ($B==1$ && $A==X$). As mentioned above, the goal in the example is to prove that the Output signal is zero at all times. In this example, there are no outstanding counterexamples, since the user accepted the assumption and additional logic to eliminate the counterexamples in step 962. In other examples, however, counterexamples may exist, but their existence does not change the tuning analysis 966 process in one embodiment of the present invention. Since the process steps can be accomplished differently (e.g., steps 964 and 966 can occur before 962), in an alternate embodiment the analysis tuning 916, 922 can account for whether making another assumption or adding/removing logic will eliminate an existing counterexample.

The tool estimates 1006 whether removing an assumption or logic driving a signal will cause a previously invalidated counterexample to once again become a valid counterexample. The tool iteratively analyzes each assumption and logic that drives a signal to determine whether such a known counterexample becomes valid. In this example, the tool analyzes the situation where the assumption $B==0$ is eliminated and determines that eliminating this assumption has no effect on the first counterexample CE1 but will cause the second counterexample CE2 to become valid once again. Similarly, the tool analyzes the situation where the assumption $F==0$ is eliminated and determines that eliminating this assumption has no effect on the counterexample CE2 but will cause the counterexample CE1 to become valid once again. The invention then analyzes whether removing the logic that drives signal H will cause a previous counterexample to become valid. In this example, removing the logic that drives signal H (CL2) will not cause either CE1 or CE2 to reappear.

The tool then estimates 1008 the cost savings of removing each assumption and each collection of logic driving a signal. Removing the assumption $B==0$ will not result in any significant cost increase because no logic has been eliminated due to this assumption. In contrast, removing the assumption $F==0$ will result in a significant cost increase because the cost of analyzing complex logic blocks CL1, CL4, and CL5 (or alternatively only CL1, since CL4 and CL5 can be eliminated by modifying the analysis regions) is significant in this example. The complexity may be on the order of several thousand because of the sizes of the BDDs for three pieces of logic. Because of the complication introduced by the logic blocks originally rendered irrelevant by the assumption, the tool may present several alternatives regarding the assumption "$F==0$". For example, the tool may put back CL1, CL4, and CL5 so that the cost would be high, or alternatively keep out CL1, CL4, and CL5 so that the cost would be low but the chances of causing a new counterexample to appear is high. Removing the complex logic that drives signal H (CL2) will also result in a cost savings based upon, for example, the size of the BDD representing the CL2 logic.

The cost information and the effect on previous (or existing) counterexample information is presented 1010 to the user, which allows the user to select 1012 none, one, or more than one of the assumptions and/or logic driving signals. In addition, the tool permits the user to enter assumptions or modify the logic to be analyzed that the tool does not present. In this example, the user may elect to eliminate the logic (CL2) that drives signal H. It is noted that while the removal of the logic CL2 will not cause the previously invalidated counterexamples to reappear, it will lead to a new counterexample that represents a false negative, as removing CL2 enables H to take value 0 or 1 at any time.

Referring to FIG. 1B, once the tuning 966 is performed (if at all), the tool again analyzes 954 the design with the modifications selected by the user. In this iteration of the design analysis, one counterexample (CE3) is identified:

$H==1 \&\& B==X \&\& F==X$

That is, the output is equal to 1 when signal H is equal to 1. The tool identifies 956 that a counterexample exists and the user indicates 958 that the counterexample is not the result of a design error. Then the tool attempts to remove the counterexample in step 962. As described above, step 962 is described in greater detail in FIG. 3. Since the entire design 1101 is not being analyzed, the tool receives a set of boundary nets for the analysis region along with the currently valid counterexamples, i.e., CE3. Eventually the tool detects the addition of logic CL2 will invalidate CE3 and the user may select to add CL2 back into the analysis region.

The tool then analyzes 1104 the primary inputs (signals B and F) as described above with reference to FIG. 4. The tool identifies whether the user has added 1204 any additional primary input assumptions. In this example, no additional assumptions are added, so the tool attempts to generate a set of assumptions on primary inputs that will eliminate counterexamples. Neither signal B nor signal F will have any effect on CE3 because both are "don't care" in CE3. The process continues by determining 1106 whether any logic drive the inputs to the analysis region 1402. Complex logic block CL2 drives signal H, which is an input to the analysis region. It is noted that CL2 is the logic that was previously eliminated from the analysis region in step 966. The tool estimates 1108 how much logic is necessary to invalidate any counterexample. In this example, the invention estimates 1108 that entire block CL2 should be added to the analysis region. The tool then estimates 1110 the cost of adding CL2 back and presents 1114 the cost and effect of adding the logic to the user. The user may elect to add CL2 back despite the cost because it eliminates a counterexample, and the tool receives 1116 the instruction provided by the user.

In one example, the user does not indicate 964 that the analysis is too slow, and the design is analyzed 954 once again. If no counterexamples are generated 956 by the design analysis 954, the user is then provided an opportunity to indicate 970 whether the analysis was too slow. If the analysis was not too slow, as indicated by the user, the process ends. If the analysis was too slow, the tool again tunes 972 the analysis as described above with reference to step 966. The analysis tuning process 972 is described in greater detail with reference to FIG. 2. The tool receives 1002 the set of assumptions for primary inputs and/or signals within the analysis region, as set forth above. Then the tool estimates 1006 whether removing an assumption or logic driving a signal will cause a counterexample to reappear. At this point, the tool analyzes the assumptions with reference to counterexamples CE1, CE2, and CE3. In addition, the logic that drives signal H (CL2) is analyzed. But since the previous iteration of step 1006 (which was called from step 964), a new counterexample was identified and eliminated (i.e., CE3). In estimating 1006 whether the removal of complex logic CL2 will cause a counterexample to reappear, the removal of CL2 is compared to CE3 (H==1). Removing the logic CL2 may result in the reappearance of CE3, and this information is presented 1010 to the user along with the other effects and savings 1008. The user decides 1012 whether to make any modifications to the assumptions or signals, in this example the user decides that no additional modifications are necessary. In one embodiment the tool continues by analyzing 954 the design. In another embodiment, since no changes occurred in the analysis tuning step 972, the process ends.

Because the above examples only have combinational logic, the cost can be determined easily using, as one factor, the size of the BDD representing the logic. When sequential logic is in the design, however, different factors are used to determine the cost/complexity. In addition, the tool may also operate with other design elements, such as multiplexers. Additional details regarding their operation is set forth in U.S. application Ser. No. 10/745,993, filed Dec. 24, 2003, which is incorporated by reference in its entirety.

Resolving Inconsistencies

In one embodiment, the tool uses a quick analysis to discover the differences between the counterexample from the current abstraction (represented by the analysis region) and the logic in the full design. Through an efficient preprocessing stage and/or a quick traversal of the design with respect to the current counterexample, a tool can quickly identify the mismatch between the current counterexample and the full design, and then present the feedback to the user. As a result, this complements the function of the tool on both cost and effect.

Figure 7A:
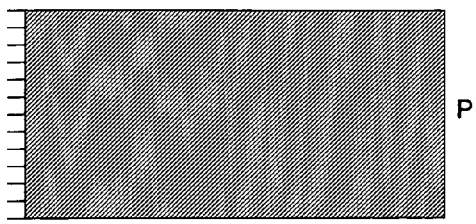
FIGS. 7A through 7F illustrate an embodiment of a process for resolving an example inconsistency between a circuit design and its abstraction.
Figure 7B:
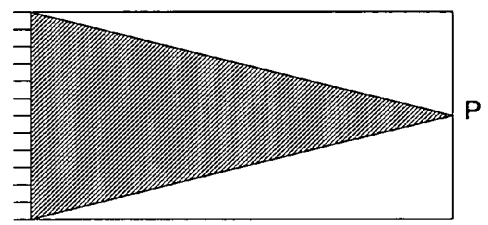

FIGS. 7A through 7F illustrate conceptually an embodiment of the inconsistency resolution process described in more detail below. For reference, FIG. 7A illustrates an entire circuit design for which a property, P, is to be verified. The shaded region in the rectangle represents the circuitry in the design that is to be considered during a functional verification process, and the taps on the left of the shaded region represent the inputs to the circuit design. As mentioned above, it may not be feasible to consider an entire design during functional verification, due to the state space explosion problem. Accordingly, the concept of a cone of influence has been developed, in which only the circuitry that drives a particular property is considered when verifying the property. FIG. 7B illustrates a cone of influence for the circuit design for property P, with the shaded cone representing the circuitry to be considered during functional verification and the unshaded portion representing circuitry in the design that is ignored. The theory behind the cone of influence is that the unshaded circuitry need not be considered because it will not affect the property.

Figure 7C:
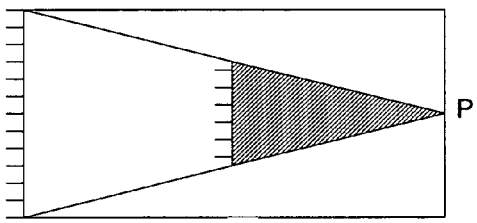

But even using the cone of influence concept, the circuit may be too complex to verify the property P. Accordingly, additional portions of the circuit design can be ignored during functional verification. For example, as shown in FIG. 7C, a portion of the cone of influence is eliminated from consideration, so that a reduced analysis region will be considered. The analysis region is represented by the shaded region of the circuit design in FIG. 7C. One or more inputs of the analysis region are internal signals of the design. (An analysis region need not be limited to being only a subset of the cone of influence, but rather could be any subset of a circuit design used to verify a property of the design.) But because these internal inputs are not constrained (e.g., by the circuitry in the design that drives these internal inputs), it is possible that a verification of the property P may return a false negative. This is because by leaving the internal inputs completely unconstrained, the possible states of the analysis region alone are more than if that portion of the circuit design were constrained by the design. Therefore, if the property P were verified true, a designer would know that the property is satisfied. But if the property were verified as false, the designer would not know whether there was actually an error in the circuit design or whether a false negative was caused by the abstraction. If the latter is true, there is an inconsistency between the circuit design and its abstraction. As used herein, an abstraction for a circuit design may be a subset of the circuit design (such as an analysis region) used in place of the circuit design for verifying a property.

Figure 7D:
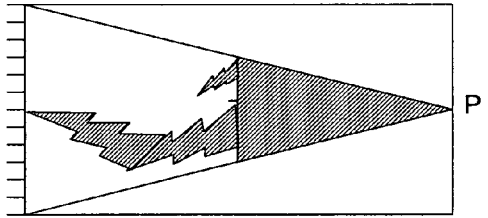

If there is an inconsistency, the designer must eliminate the inconsistency to verify the property P as true or false. Because the inconsistency is caused by the lack of constraints on the analysis region, there are at least two ways to eliminate it: (1) add circuitry to the analysis region to constrain its internal inputs, and (2) add an assumption to constrain the behavior of an internal input. FIG. 7D illustrates and example of an analysis region for which the driving logic of some of the inputs has been added to the analysis region. In one case, driving logic is added all the way back to an external input of the circuit, whereas in other cases the added driving logic is only for a portion of the design. As adding portions of the circuit back to the analysis region adds to the complexity of the functional verification analysis, preferably the minimal amount of logic necessary to resolve the inconsistency is added.

Figure 7E:
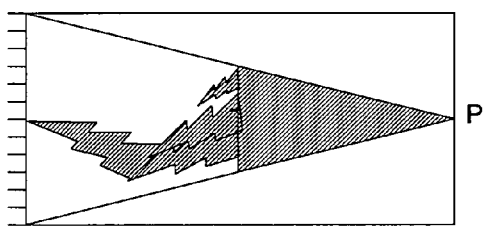
Figure 7F:
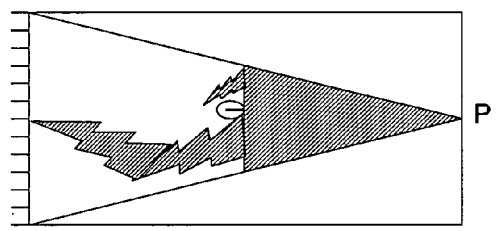

In FIG. 7D, one internal input for the analysis region is shown. To illustrate how an inconsistency can be resolved, it is assumed that a designer suspects that the inconsistency is caused by the fact that this internal input is unconstrained. Accordingly, the designer may add the portion of the circuit design that drives this internal input to the analysis region, as shown in FIG. 7E. The verification analysis is again performed to see whether the property P can be verified as true or false, without any further inconsistencies. The designer may choose this option if the designer suspects that the design might have an error in the portion of the circuit added to the analysis region, since the result of this correction is to test that portion of the circuit design. The designer may also add logic to verify the property true, the added logic in the abstraction resulting in a true result for the property when verified.

Alternatively, the designer may be confident that no errors exist in the portion of the design that drives the input. In such a case, the designer may add an assumption to the analysis that constrains the input in a way that is likely to eliminate the inconsistency. A benefit of adding an assumption instead of adding to the analysis region is to avoid slowing down the verification analysis by avoiding making the analysis region more complex. Typically, the assumption will constrain the input similar to how the input's driving logic does. The verification analysis is again performed to see whether the property P can be verified as true or false, without any further inconsistencies. Preferably, the assumption itself is verified, for example just as a property is verified as described herein; otherwise, the added assumption may mask a true error in the circuit design. It can be appreciated that assumptions need not be used merely when it is thought that the driving logic replaced by the assumption does not contain an error. For example, when a designer suspects that the driving logic does contain an error, the assumption can be used to isolate that logic while proving the remaining portion of the circuit design true, later attempting to detect the suspected error when verifying the added assumption.

The tool may use waveform debugging sessions to guide the user to modify the analysis region until the final analysis region is small enough to finish the proof in a short time and yet complete enough to verify the specified property. U.S. application Ser. No. 10/745,993, filed Dec. 24, 2003, referenced above, guides the user through the cost and effect analysis of the current analysis.

In another embodiment, the tool may also use the data from the analysis to modify the abstraction represented by the analysis region to resolve the conflicts when requested by the user. One conventional system that uses abstraction models to verify designs is described by Dong Wang, Pei-Hsin Ho, Jiang Long, James Kukula, Yunshan Zhu, Tony Ma, & Robert Damiano, "Formal Property Verification by Abstraction Refinement with Formal, Simulation and Hybrid Engines," Design Automation Conference 2001 (Carnegie Mellon University & Synopsys Inc.). When using an abstract model to verify a concrete design, many previous solutions, such as the one described in this paper, involve the following two steps: (1) converting an abstract counterexample from the abstract model to a concrete counterexample for the original design before presenting the counterexample to the user (e.g. section 2.3 in the referenced paper), and (2) if the conversion fails, analyzing the counterexample from the abstract model to identify a refinement scheme.

As the process of modifying the abstraction used in the circuit design can be very complex, it may be desirable to use heuristics to attempt the conversion instead of doing a precise conversion. In the referenced paper, the authors employ sequential automatic test pattern generation (ATPG) technique to do the conversion, although this may have a high overhead. On the other hand, in this paper, the authors use a refinement scheme that detects crucial-register candidate at the primary input of the abstract model and includes its full combinational transitive fan-in to the abstract model. It is noted that the "full combinational transitive fan-in" is defined as the combinational logic between the candidate and other flops in the design. The refinement process then proceeds using an iterative process of adding a candidate register and testing if the new abstract model still exhibits a similar abstract counterexample. If the counterexample is no longer corrected with the cumulative changes to the abstraction, the refinement proceeds with removing each addition one by one and testing if the counterexample becomes satisfiable again.

The approach in the referenced Wang paper and other similar previous solutions have used the following steps:
(a) The tool runs a formal analysis on the abstract model. If true, done. If false, go to step (b).
(b) The tool generates an abstract counterexample.
(c) The tool attempts to convert the counterexample to a concrete counterexample. If successful, present the concrete counterexample to the user and report to the user about the error. If not, go to step (d).
(d) The tool identifies candidate signals at the primary input of the abstract model.
(e) The tool refines the candidates by adding or removing them and then checks with a similar abstract counterexample exists.
(f) The tool expands the abstract model with the full combinational transitive fan-in of the final candidates. Go to step (a).

Advantageously, the tool improves the practicality of formal verification. First, the tool may present the abstract counterexample to the user instead of attempting to do the conversion into a concrete counterexample, thus avoiding the overhead of conversion. In addition, the tool may involve an interactive process with the user instead of being fully automated. This interactive step allows the user to pick the candidate signals instead of acting on a subset of them through the potentially expansive heuristics.

In one embodiment, the tool uses a specific coloring convention in the waveform of an abstract counterexample to help the user understand that the counterexample is not a concrete counterexample for the full design. For example, when a signal is colored red, the signal may have arbitrary values regardless of the actual logic driving the signals. It will be apparent that a variety of color schemes may be used in various embodiments of the invention.

In another embodiment of the invention, the tool provides additional information to a user to allow the user to make intelligent decisions: (1) the ability to let the user visualize more effectively the difference (i.e., a conflict) between the abstract counterexample and the actual concrete design, and (2) the ability to modify the abstraction represented by the analysis region more effectively to resolve the difference (conflict) between the abstract counterexample and the actual concrete design. Effective visualization of the differences enables a user to choose which conflicts to resolve. It also avoids irrelevant conflict resolution with respect to the current property to be proven.

In one embodiment, the tool employs the following quick analysis to facilitate step 962 in FIG. 1B, enabling the user to detect conflicts between the current abstract counterexample and the original design:

Step 1: Perform reset analysis on the design to obtain values for the flops coming out of reset. This can be performed once, typically after the counterexample is initially generated.

Step 2: Assign values to all (or a subset) the flops in the original design for the cycle right after the reset condition is de-asserted, using the values from the reset analysis.

Step 3: Assign values to all (or a subset) the primary inputs in the original design. If the primary input to the design is also a primary input to the boundary of the analysis region, assign the input the value from the abstract counterexample(s). Otherwise, assign the value 'X' to the primary input of the design.

Step 4: Perform forward values propagation (similar to a 3-value simulation) to detect conflict, without going through formal analysis such as a sequential ATPG algorithm.

Step 5: Automatically resolve conflicts from step 4 or highlight the conflicts and present it to the user to indicate the primary differences between the counterexample from the analysis region and the original design.

In one embodiment, the tool performs the forward value propagation according to the following procedure:

Step 1: Start with the clock cycle right after the reset condition is de-asserted, go to step 2.

Step 2: Perform forward value propagation in the combinational logic of the original design using the existing value assignments to the primary inputs, the flops, and the boundary of the analysis region for this clock cycle. (The first time this step is executed, all the non-primary inputs at the boundary of the analysis region are assigned value 'X'.) This value propagation may follow the same semantic as a typical 3-value simulation, except: (a) the value of an input to the analysis region obtained through this process is stored separated (without overwriting the existing value assignment so the new value is not propagated to the rest of the design), and (b) the value of the driver for a flop is not propagated to be the value of the flop in the next clock cycle (this propagation done in step 4). This forward value propagation semantic may include: (a) propagating a concrete value 0 or 1 if all the inputs of a gate or a block have concrete values 0 or 1 according to the characteristics of the gate/block, (b) propagating the value 'X' for an AND gate if none of the inputs have value 0 and at least one of the inputs has value 'X', (c) propagating the value 'X' for a OR gate if none of the inputs have value 1 and at least one of the inputs has value 'X', and (d) performing similar actions for a MUX and other gates and logic blocks.

Step 3: For each input to the analysis region, if the boundary input has a value assignment (from the counterexample or from a previous execution of this step) that is not consistent with the values obtained in step 2, an action needs to be taken depending on the following possible situations:

Situation A: If the original value is X and the new value from step 2 is 0 or 1, the input is marked, and the value from step 2 is assigned to this input.

Situation B: If the original value is 0 or 1 and the new value from step 2 is X, the input is marked, and the value from step 2 is assigned to this input.

Situation C: If the original value is 1 and the new value from step 2 is 0, the input is marked, and the value X is assigned to this input.

Situation D: If the original value is 0 and the new value from step 2 is 1, the input is marked, and the value X is assigned to this input.

Assigning value X to the input in situations C and D avoids highlighting conflicts that tightly coupled with each other; therefore, only primary conflicts are generated.

If any input to the analysis region is marked in this process, to process proceeds to step 2, and incremental value propagation is performed only on the portion of the design that is affected by the marked inputs (staying in the same clock cycle). The inputs marked in situations C and D are noted as conflicts detected through this analysis (not A and B). If none of the input is marked, the process proceeds to the step 4.

Step 4: Propagate the values of the drivers of the flops in the original design to be the values of the flops in the next clock cycle, and then proceed to step 2 for the next clock cycle until all clock cycles from the current trace is processed. It is noted that, in this embodiment, there is no backtracking in this algorithm using value propagation (e.g., in contrast to ATPG, which involves backtracking). Accordingly, this is a fast algorithm with a small and predictable complexity in term of time and memory.

Figure 8:
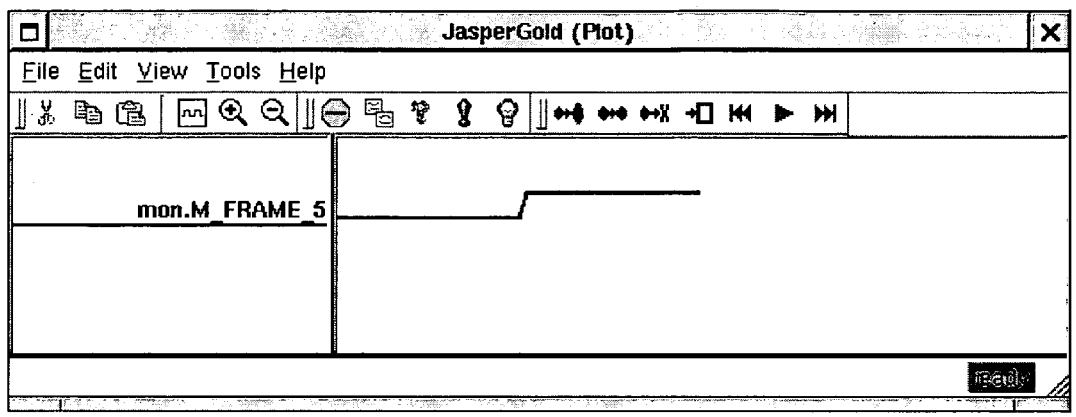
FIG. 8 is a user interface for presenting a user with a counterexample, in accordance with an embodiment of the invention.
Figure 9:
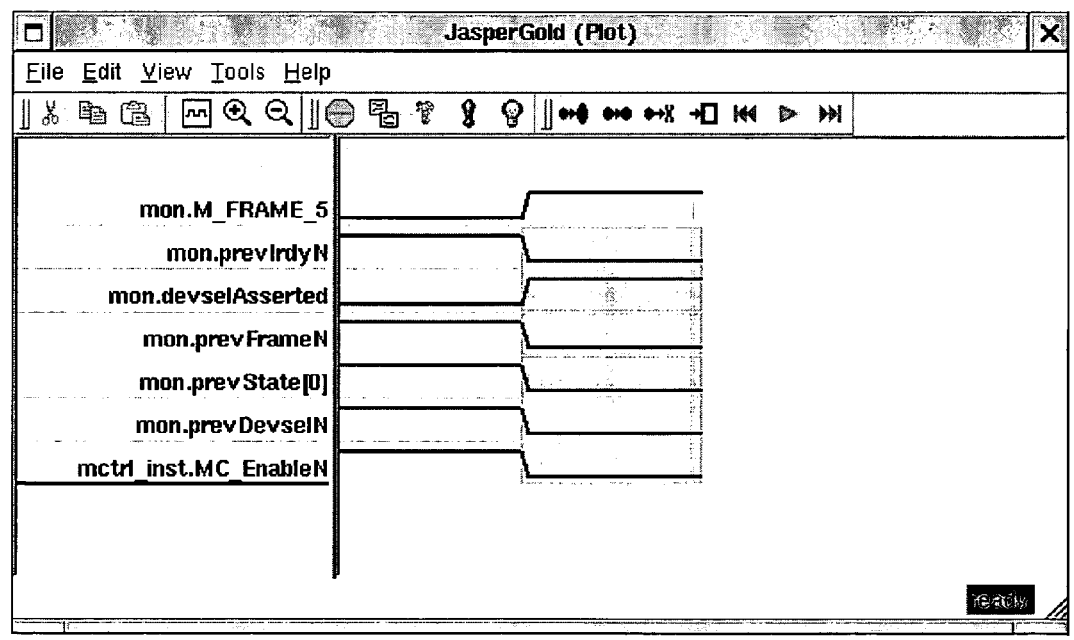
FIG. 9 is a user interface for presenting a user with a visualization of an inconsistency, in accordance with an embodiment of the invention.

Once the conflicts are detected, they can be automatically used by the formal verification algorithm to modify the analysis region, or they can be presented to the user as a summary about the different between the abstraction and the original design. An example of a user interface for presenting these conflicts to a user is shown in FIG. 8. In one embodiment, shown in FIG. 8, a counterexample is presented to the user. The user may then select an option (e.g., click on a button) to initiate the conflict analysis. In response, the tool switches from displaying the plot showing the counterexample (like the one illustrated in FIG. 8) to displaying a plot showing the conflict (like the one illustrated in FIG. 9). The signals that have associated conflicts are automatically added to the plot, and the time step in which the conflicts occur are highlighted. The tool may present the costs and effects of modifying the analysis region. With the highlight, the user can click on another button to initiate modification of the analysis region to remove all conflicts, the user can select a subset of them to avoid unnecessary conflict resolution, or choose not to remove the conflict. Alternatively, instead of modifying the analysis region by adding signals, the user may add an assumption to remove a conflict. The cost of adding an assumption may be lower than the cost of adding the logic that removes the conflict.

Using the data obtained in the above propagation procedure, specific logic outside the analysis region can be extracted to resolve the conflict. In one embodiment, this procedure is carried out with the following steps:

Step 1: Given a conflict signal (e.g., an input to the analysis region) go to step 2. This signal must have a value from a counterexample that is different from the value from the value propagation.

Step 2: Starting from the conflict signal, traverse from the output of a gate or a block of logic to the inputs of the gate/block according to the following decision criteria:

Situation A: If the logic is a flop, mark the flop and go to step 2 to process the driver of the flop.

Situation B: If the logic is an AND gate and the value from the value propagation is 1, then the values from the value propagation for all inputs must be one. Mark the AND gate and go to step 2 to process both portion of the logic driving the two inputs.

Situation C: If the logic is an AND gate and the value from the value propagation is 0, then at least one of the values from form the value propagation for the inputs must be 0. Pick one of the inputs with value 0, mark the AND gate and go to step 2 to process the portion of the logic driving the selected input.

Similar criteria are applied for a, OR gate, a MUX, and other types of gates and logic blocks. When the traversal has reached the primary inputs of the original design, go to step 3.

Step 3: The logic marked in step 2 is determined to be the logic that removes the specified conflict. In another embodiment, the logic that removes the specified conflict is a subset of the logic marked in Step 3. Alternatively, the tool may traverse back from the conflict signal, marking gates and logic blocks by the above criteria, until it reaches a flop, which is marked. As an optimization, the tool may continue back from this marked flop, marking gates and logic blocks and other flops if it does not increase the number of nets in the analysis region. The process stops once it hits logic that would increase the number of nets in the analysis region. The logic marked removes the specified conflict.

In one embodiment, this algorithm is implemented in an efficient way by using a caching scheme. In the caching scheme, when a previously analyzed signal during step 2, the cached result is used instead of repeating the traversal again.

The use of the logic marked in this process to modify the abstraction represented by the analysis region can be a very effective in removing the conflict, with a small and predictable complexity in term of time and memory. The logic marked in this process may have many inputs at its boundary. This leads to two optional optimizations. The first optimization is to relate some of the inputs to each other and slightly expand the logic to remove future counterexamples (e.g., in the next iteration of the loop 954, 962 in FIG. 1B). This expansion can be determined by simple heuristics, such as including buffers that feed into two inputs to the identified logic and were driven by the same signal. In the second optimization, depending on the actual formal analysis algorithm used in step 954 to analyze the analysis region, if the performance of the algorithm depends on the number of inputs at the boundary of the analysis region (for example, a dynamic variable reordering algorithm in an algorithm using binary decision diagram BDD), a post processing step may be used to get a slight bigger analysis region with fewer boundary inputs.

An embodiment of the tool also takes advantage of an optional preprocessing step between step 952 and 954 in FIG. 1B. This preprocess step ignores the analysis regions that are used for the formal analysis, and extracts "global behaviors" from the original design. These "global behaviors" conceptually summarizes the behaviors for all or most concrete counterexamples. This preprocess step may use the following steps:

Step 1: Perform reset analysis on the design to obtain values for the flops coming out of reset.

Step 2: Assign value 'X' to all inputs to the design.

Step 3: Perform 3-value simulation of the design for a predetermined number of clock cycles, propagating the value 0, 1, or 'X' whenever appropriate, without consideration of any analysis region.

Step 4: Collect non-X values from the signals (both flops and internal wires) at each clock cycle.

The resulting non-X values at each clock cycle represent the "anchor" from which all concrete counterexamples should match. This information can be utilized in at least two ways. For example, when the formal analysis of an analysis region with respect to the requirement is performed, the inputs of the analysis region can be tied to the non-X values from this preprocessing step. As a result, many abstract counterexamples that exhibit an illegal input to the analysis region will not be generated. In addition, when an abstract counterexample is generated from the formal analysis of an analysis region, the signals with non-X values from this preprocessing step do not need to be analyzed again, as a simple comparison of the value from this preprocessing step and the value from the counterexample can determine whether it is a conflict.

Because most formal verification techniques (for example, those based on the reachability analysis) generate counterexamples of a short length, this preprocessing step does not need to simulate the design for a large number of clock cycles. Furthermore since the value 'X' is assigned to all inputs at all clock cycles, mostly likely all flops will be assigned the value 'X' after a small number of clock cycles. While this indicates the limitation of this technique, it provides sufficient information to convert the initial analysis region extracted by the tool to a more appropriate analysis region with minimal computation overhead before executing the other steps of the current invention.

In the examples above, the former style applies to an interactive solution, and the latter style applies to a fully automated solution. A hybrid between the two may be appropriate. For example, the tool may selectively use only the latter style for the cycle right after the reset condition is de-asserted. In this way, the user does not have to interactive resolve conflict due to the analysis region not considering the proper reset value. The tool then highlights the rest of the conflict for the user to decide whether to resolve it, so that counters or other logic that may unnecessarily slow down the formal analysis would not be automatically included.

When the analysis needs to be modified to resolve conflicts to such non-X values (either automatically or indicated by the user), the same technique as described previously can be utilized to include a tight potentially sequential portion of logic to the abstraction.

Embodiments of the invention address at least two related issues in formal verification that involves abstraction: (1) the ability to let the user visualize more effectively the difference (conflict) between the abstract counterexample and the actual concrete design, and (2) the ability to modify the abstraction quickly and without expensive overhead to resolve the differences (conflicts) between the abstract counterexample and the original design. Visualization of conflicts enables a user to check quickly the differences between the abstract counterexample and the full design. A user without a formal verification background typically does not know what abstractions for circuit designs are, which is why many conventional systems avoid presenting the abstract counterexample directly to the user. With the visualization techniques described herein, a novice user can quickly determine if there is any primary source of discrepancy in the counterexample when compared to what they would expect in a concrete counterexample. It also allows the novice to react to the conflicts in appropriate manner.

Accordingly, embodiments of the tool avoid the need to spend expensive computation resource to convert the counterexample to a concrete counterexample. Moreover, they also allow a user to pick and choose which discrepancy to resolve so that the tool need not act on all discrepancies, which could cause performance problems during the proof process.

SUMMARY

Reference in the specification to "one embodiment" or to "an embodiment" means that a particular feature, structure, or characteristic described in connection with the embodiments is included in at least one embodiment of the invention. The appearances of the phrase "in one embodiment" in various places in the specification are not necessarily all referring to the same embodiment.

Some portions of the detailed description that follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations of physical quantities as modules or code devices, without loss of generality.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device, that manipulates and transforms data represented as physical (electronic) quantities within the computer system memories or registers or other such information storage, transmission or display devices.

As described, various embodiments of the invention allow a user to specify requirements graphically using a waveform and an interactive and/or automatic generalization process.

These embodiments may take the form of standalone software, or they may be embedded as tools within a larger circuit design software environment.

Moreover, any of the steps, operations, or processes described herein can be performed or implemented with one or more software modules or hardware modules, alone or in combination with other devices. It should further be understood that any portions of the system described in terms of hardware elements may be implemented with software, and that software elements may be implemented with hardware, such as hard-coded into a dedicated circuit. In one embodiment, a software module is implemented with a computer program product comprising a computer-readable medium containing computer program code, which can be executed by a computer processor for performing any or all of the steps, operations, or processes described herein.

The present invention also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and displays presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the present invention as described herein, and any references below to specific languages are provided for disclosure of enablement and best mode of the present invention.

In addition, the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the following claims.

The foregoing description of the embodiments of the invention has thus been presented for the purpose of illustration; it is not intended to be exhaustive or to limit the invention to the precise forms disclosed. Persons skilled in the relevant art can appreciate that many modifications and variations are possible in light of the above teachings. It is therefore intended that the scope of the invention be limited not by this detailed description, but rather by the claims appended hereto.

What is claimed is:

1. A computer-implemented method for resolving inconsistencies between a circuit design and its abstraction, the method comprising:

performing functional verification to analyze an abstraction of a circuit design, the abstraction comprising an analysis region that includes a portion of the circuit design;

simulating the circuit design;

detecting an inconsistency between the analyzed abstraction and the simulated circuit design, wherein detecting the inconsistency comprises observing a conflict between a signal in the analyzed abstraction and a corresponding signal in the simulated circuit design;

presenting the inconsistency in a display device for a user to review, wherein presenting the inconsistency comprises displaying information about at least one of the signals having the conflict;

receiving a user input for eliminating the inconsistency, the user input comprising a modification to the abstraction to eliminate the inconsistency; and adjusting the analysis region of the abstraction according to the user input to eliminate the inconsistency, the adjusting performed by using a computer.

2. The method of claim 1, wherein displaying information comprises displaying a waveform of the signal in the analyzed abstraction.

3. The method of claim 1, further comprising:

responsive to the user input, adding a portion of the circuit design to the analysis region to expand the abstraction.

4. The method of claim 3, wherein the user input identifies an input signal of the analysis region, and the added portion includes at least a portion of the circuit design that drives the input signal.

5. The method of claim 3, further comprising:

performing functional verification on the expanded abstraction; and determining whether an inconsistency exists between the analyzed expanded abstraction and the simulated circuit design.

6. A method for verifying a circuit design, the method comprising:

repeating the method of claim 5 until (a) the abstraction is verified true, or (b) an error is detected in the analysis region of the circuit design.

7. The method of claim 1, wherein the user input comprises an assumption for use in functional verification of the analyzed abstraction, wherein the assumption eliminates the inconsistency between the simulated circuit design and the analyzed abstraction.

8. The method of claim 7, further comprising:

performing functional verification to verify the abstraction using the assumption.

9. The method of claim 1, wherein the user input identifies a portion of the circuit design to be added to the analysis region to expand the abstraction, and the method further comprises:

calculating a cost associated with performing functional verification on the expanded abstraction; and providing the cost to the user.

10. The method of claim 9, wherein the user is provided the cost before the user input is received.

11. The method of claim 1, wherein the user input identifies an assumption to eliminate the inconsistency between the circuit design and abstraction, and the method further comprises:

calculating a cost associated with performing functional verification on the abstraction with the assumption; and providing the cost to the user.

12. The method of claim 11, wherein the user is provided the cost before the user input is received.

13. The method of claim 1, wherein the abstraction contains a superset of behaviors exhibited by the circuit design.

14. A computer program product for resolving inconsistencies between a circuit design and its abstraction, the computer program product comprising a computer-readable medium containing computer program code, that when executed by a computer, performs a method comprising:
- performing functional verification to analyze an abstraction of a circuit design, the abstraction comprising an analysis region that includes a portion of the circuit design;
- simulating the circuit design;
- detecting an inconsistency between the analyzed abstraction and the simulated circuit design, wherein detecting the inconsistency comprises observing a conflict between a signal in the analyzed abstraction and a corresponding signal in the simulated circuit design;
- presenting the inconsistency in a display device for a user to review, wherein presenting the inconsistency comprises displaying information about at least one of the signals having the conflict;
- receiving a user input for eliminating the inconsistency, the user input comprising a modification to the abstraction to eliminate the inconsistency; and
- adjusting the analysis region of the abstraction according to the user input to eliminate the inconsistency.

15. The computer program product of claim 14, wherein displaying information comprises displaying a waveform of the signal in the analyzed abstraction.

16. The computer program product of claim 14, wherein the computer-readable medium further contains computer program code for:
- responsive to the user input, adding a portion of the circuit design to the analysis region to expand the abstraction.

17. The computer program product of claim 16, wherein the user input identifies an input signal of the analysis region, and the added portion includes at least a portion of the circuit design that drives the input signal.

18. The computer program product of claim 16, wherein the computer-readable medium further contains computer program code for:
- performing functional verification on the expanded abstraction; and
- determining whether an inconsistency exists between the analyzed expanded abstraction and the simulated circuit design.

19. The computer program product of claim 14, wherein the user input comprises an assumption for use in functional verification of the analyzed abstraction, wherein the assumption eliminates the inconsistency between the simulated circuit design and the analyzed abstraction.

20. The computer program product of claim 19, wherein the computer-readable medium further contains computer program code for:
- performing functional verification to verify the abstraction using the assumption.

21. The computer program product of claim 14, wherein the user input identifies a portion of the circuit design to be added to the analysis region to expand the abstraction, and wherein the computer-readable medium further contains computer program code for:
- calculating a cost associated with performing functional verification on the expanded abstraction; and
- providing the cost to the user.

22. The computer program product of claim 21, wherein the user is provided the cost before the user input is received.

23. The computer program product of claim 14, wherein the user input identifies an assumption to eliminate the inconsistency between the circuit design and abstraction, and wherein the computer-readable medium further contains computer program code for:
- calculating a cost associated with performing functional verification on the abstraction with the assumption; and
- providing the cost to the user.

24. The computer program product of claim 23, wherein the user is provided the cost before the user input is received.

25. The computer program product of claim 14, wherein the abstraction contains a superset of behaviors exhibited by the circuit design.

26. A computer-implemented method for resolving inconsistencies between a simulated circuit design and an analyzed abstraction of the circuit design, the abstraction comprising a portion of the circuit design, the method comprising:
- a step for detecting an inconsistency between the simulated circuit design and the analyzed abstraction, wherein detecting the inconsistency comprises observing a conflict between a signal in the analyzed abstraction and a corresponding signal in the simulated circuit design;
- a step for visualizing the inconsistency in a display device for a user to review, wherein visualizing the inconsistency comprises displaying information about at least one of the signals having the conflict;
- receiving a user input for eliminating the inconsistency, the user input identifying a proposed modification of the analyzed abstraction; and
- modifying the analysis region of the abstraction based on the user input, the modifying performed by using a computer.

27. The method of claim 26, further comprising:
- modifying the abstraction based on the user input.

28. The method of claim 27, wherein modifying the abstraction comprises adding a portion of the circuit design to the abstraction.

29. The method of claim 27, wherein modifying the abstraction comprises adding an assumption to the abstraction.

30. The method of claim 27, further comprising:
- a step for detecting an inconsistency between the simulated circuit design and the analyzed modified abstraction.

31. A method for verifying a circuit design, the method comprising repeating the method of claim 30 until (a) the abstraction is verified true, or (b) an error is detected in the abstraction portion of the circuit design.

32. The method of claim 26, further comprising:
- a step for computing a cost associated with modifying the abstraction according to the user input; and
- presenting the cost to a user before receiving the user input.

33. The method of claim 26, wherein the abstraction contains a superset of behaviors exhibited by the circuit design.

* * * * *